United States Patent
Shen et al.

(10) Patent No.: US 8,829,950 B2
(45) Date of Patent: Sep. 9, 2014

(54) EFFICIENT REDUCTION OF ELECTROMAGNETIC EMISSION IN LIN DRIVER

(71) Applicant: STMicroelectronics R&D Co. Ltd. (Shanghai), Shanghai (CN)

(72) Inventors: Tina Shen, Shanghai (CN); Anderson Yin, Shanghai (CN)

(73) Assignee: STMicroelectronics R&D (Shanghai) Co. Ltd, Shanghai (CN)

( * ) Notice: Subject to any disclaimer, the term of this patent is extended or adjusted under 35 U.S.C. 154(b) by 0 days.

(21) Appl. No.: 13/713,285

(22) Filed: Dec. 13, 2012

(65) Prior Publication Data

US 2013/0169322 A1   Jul. 4, 2013

(30) Foreign Application Priority Data

Dec. 30, 2011   (CN) .......................... 2011 1 046 1475

(51) Int. Cl.
*H03K 3/00* (2006.01)
*H04L 25/08* (2006.01)
*H03K 4/02* (2006.01)
*H03K 3/78* (2006.01)

(52) U.S. Cl.
CPC   *H03K 3/78* (2013.01); *H04L 25/08* (2013.01); *H03K 4/023* (2013.01)
USPC ........... 327/109; 327/112; 327/170; 327/379; 327/389

(58) Field of Classification Search
USPC ......................................... 327/109
See application file for complete search history.

(56) References Cited

U.S. PATENT DOCUMENTS 6,271,709 B1 * 8/2001 Kimura et al. ................ 327/380
2010/0244907 A1 * 9/2010 Gagne et al. .................. 327/109

* cited by examiner

*Primary Examiner* — Long Nguyen
*Assistant Examiner* — Patrick Chen
(74) *Attorney, Agent, or Firm* — Gardere Wynne Sewell LLP

(57) ABSTRACT

A Local Interconnect Network (LIN) driver circuit employs a charging/discharging current applied to the gate of a driver transistor coupled to an LIN bus. The charging current includes a constant charging current and an additional soft charging current, whereas the discharging current includes a constant discharging current and an additional soft discharging current. As a result of the soft charge/discharge components, there is a significant reduction in electromagnetic emission on the LIN bus.

36 Claims, 3 Drawing Sheets

US 8,829,950 B2

EFFICIENT REDUCTION OF ELECTROMAGNETIC EMISSION IN LIN DRIVER

PRIORITY CLAIM

This application claims priority from Chinese Application for Patent No. 201110461475.7 filed Dec. 30, 2011, the disclosure of which is incorporated by reference.

BACKGROUND

1. Technical Field

The present invention relates generally to Local Interconnect Network (LIN) circuitry and, more specifically, to reducing electromagnetic emission in an integrated LIN driver.

2. Introduction

Industry specifications for LIN drivers typically mandate that a transmitted signal be shaped with a predefined slope in order to reduce electromagnetic emission at high frequencies. Unfortunately, the requested small slope oftentimes results in an invalid duty cycle, which consequently results in an error in data transmission. In an attempt to solve this issue, many conventional LIN drivers employ a step current as a gate charging/discharging current. However, the sharp edges of the step current contribute to a significant level of radiated emission on the LIN bus. Therefore, there exists a need for an LIN driver operable to ensure signal integrity while achieving reduced electromagnetic emission on the LIN bus.

SUMMARY

The present disclosure provides an integrated LIN driver having reduced electromagnetic emission. One embodiment provides a driver circuit comprising: a driver transistor having a gate terminal; a first circuit operable in response to a first phase of a clock signal to generate a gate charging current for application to the gate terminal; and a second circuit operable in response to a second phase of the clock signal to generate a gate discharging current for application to the gate terminal; wherein said gate charging current comprises a sum of a first exponentially decreasing current and a first constant current; and wherein said gate discharging current comprises a sum of a second exponentially decreasing current and a second constant current.

In another embodiment, the LIN driver circuit comprises: charging circuitry operable to receive a first charging current and generate a second charging current; discharging circuitry operable to receive a first discharging current and generate a second discharging current; and an output transistor operable to receive a gate current, wherein during a charging phase, said gate current comprises said first charging current and said second charging current, and wherein during a discharging phase, said gate current comprises said first discharging current and said second discharging current; wherein during said charging phase, said second charging current dissipates such that said gate current substantially comprises said first charging current; and wherein during said discharging phase, said second discharging current dissipates such that said gate current substantially comprises said first discharging current.

Yet another embodiment of the present disclosure provides a driver circuit comprising: a driver transistor having a gate terminal; a first circuit comprising a first capacitor coupled to a first transistor and a first switch, said first circuit operable to receive a first constant current and generate a first exponentially decreasing current; a second switch operable to couple said first circuit to said gate terminal to apply a gate charging current to said gate terminal; a second circuit coupled to said gate terminal, said second circuit comprising a third switch and a second capacitor, said second circuit operable to generate a second exponentially decreasing current; and a fourth switch coupled to said gate terminal and said second circuitry, wherein said third and fourth switches are operable to apply a gate discharging current to said gate terminal; wherein said gate charging current comprises a sum of said first exponentially decreasing current and said first constant current; and wherein said gate discharging current comprises a sum of said second exponentially decreasing current and a second constant current.

Another embodiment of the present disclosure provides a method for reducing electromagnetic emission in a driver circuit, the method comprising: generating a first exponentially decreasing current in response to a first phase of a clock signal; generating a second exponentially decreasing current in response to a second phase of the clock signal; applying a charging current at a gate terminal of a driver transistor, wherein said charging current comprises a sum of a first constant current and said first exponentially decreasing current; and applying a discharging current at said gate terminal of said driver transistor, wherein said discharging current comprises a sum of a second constant current and said second exponentially decreasing current.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF THE DRAWINGS

Embodiments are illustrated by way of example in the accompanying figures not necessarily drawn to scale, in which like reference numbers indicate similar parts, and in which.

DETAILED DESCRIPTION OF THE DRAWINGS

Figure 1A:
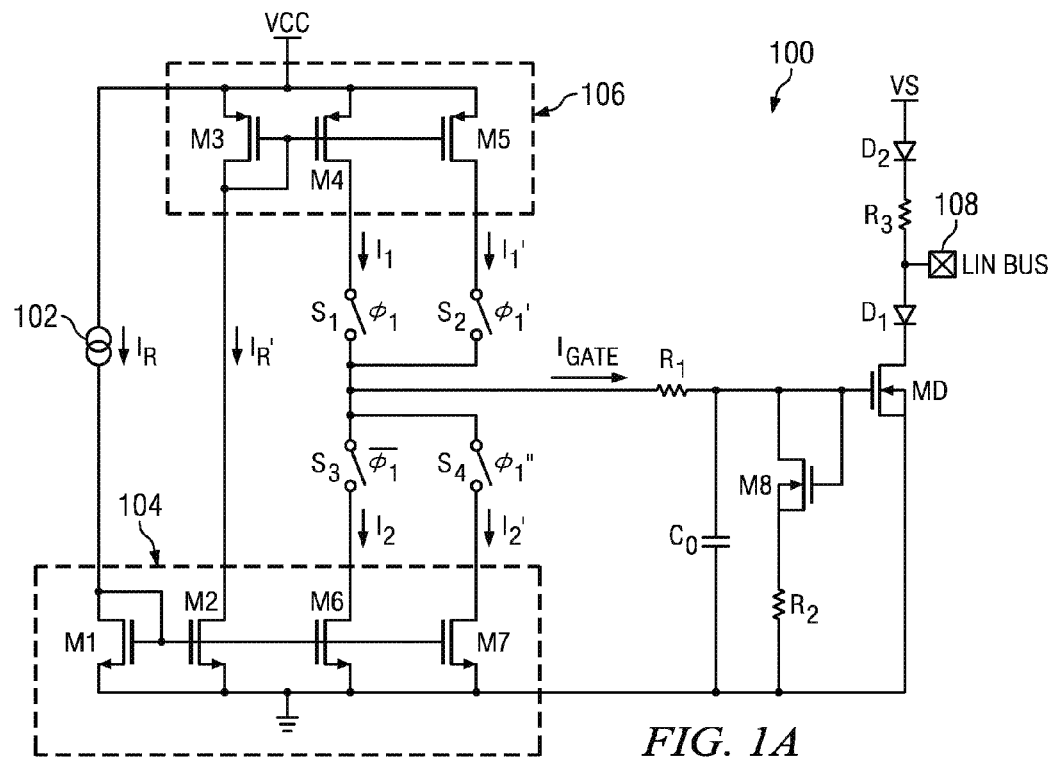
FIGS. 1A and 1B illustrate an example embodiment of a conventional LIN driver circuit and the timing diagram and waveforms corresponding to the conventional LIN driver circuit.
Figure 1B:
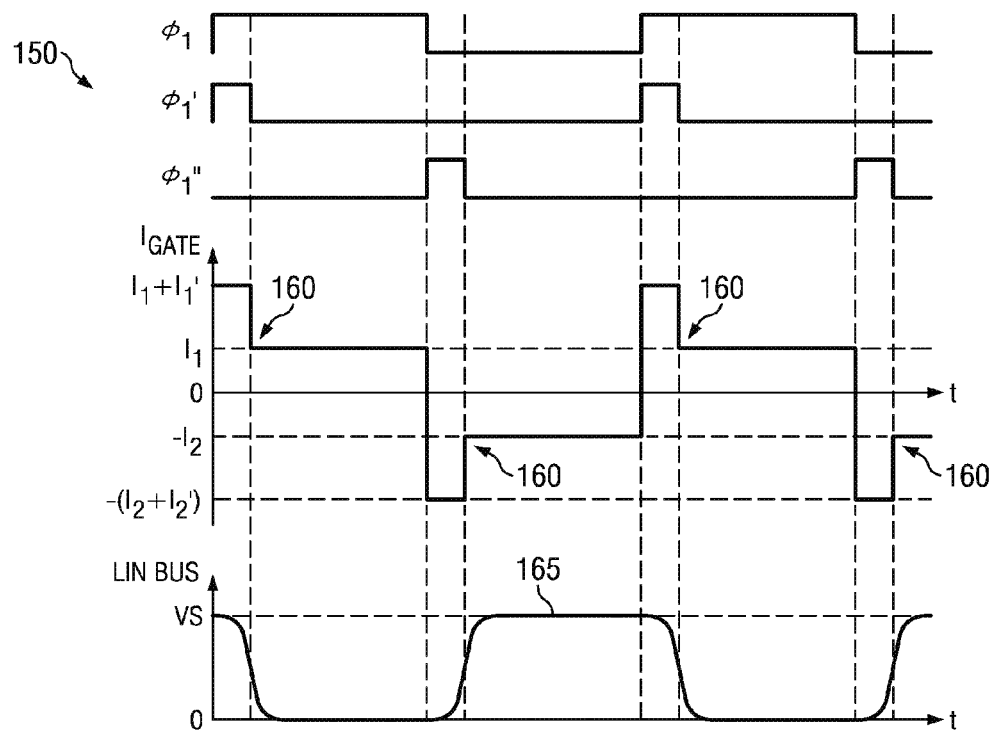

Reference is made to FIGS. 1A and 1B, wherein an example embodiment of a conventional LIN driver circuit 100 is shown in FIG. 1A, and is discussed herein in combination with its corresponding timing diagram and waveforms 150 illustrated in FIG. 1B. The conventional LIN driver circuit 100 comprises a reference current source 102 supplying reference current $I_R$ to a first current mirror 104, comprised of transistors M1 and M2. Transistor M1 may be sized to transistor M2 to set mirrored reference current $I_R'$, which is supplied to a second current mirror 206 comprised of transistors M3, M4, and M5. Transistor M4 may be sized relative to transistor M3 to set a constant charge current $I_1$, which is operably connected to the gate of a transistor MD operating as a low side driver by a switch $S_1$ operating on a phase of a first clock signal $\Phi_1$. Transistor M5 may be sized relative to transistor M3 to set an additional charge current $I_1'$, which is operably connected to the gate of the driver transistor MD by a second switch $S_2$ operating on a second clock signal $\Phi_1'$. In an example embodiment of the circuit 100 illustrated in FIG. 1A, $I_R$=5 uA, $I_R'$=10 uA, $I_1$=20 uA, and $I_1'$=7 uA.

Also included in the first current mirror 104 are transistors M6 and M7. Transistor M6 may be sized relative to transistor M1 to set a constant discharging current $I_2$, which is operably connected to the gate of the driver transistor MD by a third switch $S_3$ operating on an opposite phase of the first clock signal $\Phi_1$. Transistor M7 may be sized relative to transistor M2 to set an additional discharge current $I_2'$, which is operably connected to the gate of the driver 108 by a fourth switch $S_4$ operating on a third clock signal $\Phi_1''$. In an example embodiment of the circuit 100 illustrated in FIG. 1A, $I_2$=20 uA and $I_2'$=40 uA.

The LIN driver circuit 100 also includes resistor $R_1$, as well as capacitor $C_0$ coupled in parallel with series connected transistor M8 and resistor $R_2$, which are coupled to the gate of the driver transistor MD. Capacitor $C_0$ is provided to absorb EMC gate coupling of the driver transistor MD, and is also used with resistor $R_1$ to smooth gate charge and discharge of the driver transistor MD. Transistor M8 operates with the driver transistor MD to provide a current mirror, wherein the resistor $R_2$ is provided to adjust the mirror factor. In an example embodiment of the circuit 100 illustrated in FIG. 1A, $C_0$=20 pF.

The source of the driver transistor MD is coupled to the LIN bus 108 via a first blocking diode $D_1$ operable to block current flowing into the LIN bus 108 from ground. The driver circuit 100 also includes a second blocking diode $D_2$ and pull-up resistor $R_3$ coupled between a supply voltage VS and the LIN bus 108, wherein the second blocking diode $D_2$ operates to block current from the LIN bus 108 from reaching the voltage supply VS.

The conventional LIN driver 100 employs step current $I_{GATE}$ as a gate charging/discharging current for the driving transistor MD. In order to achieve the step current $I_{GATE}$, two constant currents are intermittently switched on and off, thereby switching between the constant charging current $I_1$ and the constant discharging current $I_2$ applied to the gate of MD as step current $I_{GATE}$. As shown in FIG. 1B, phase clock signal $\Phi_1$ is high during the charging phase and low during the discharging phase. Accordingly, charging current $I_1$ is switched on (i.e., applied to the gate of MD) during the charging phase (when $\Phi_1$ is high), and is switched off during the discharging phase (when $\Phi_1$ is low). Conversely, discharging current $I_2$ is switched off during the charging phase, and is switched on during the discharging phase.

During initial periods of the respective charging and discharging phases, an additional current is switched on to reduce turn-on/off delay time of the driver transistor MD. As illustrated by the timing diagram and waveforms 150 illustrated in FIG. 1B, during the initial period of a charging phase, phase clock signal $\Phi_1'$ is high and additional charging current $I_1'$ is switched on. Therefore, when $\Phi_1$ and $\Phi_1'$ are high, both charging current $I_1$ and additional charging current $I_1'$ are applied to the gate of the driver transistor MD. In other words, when $\Phi_1$ and $\Phi_1'$ are high, the step current $I_{GATE}$ is the sum of charging current $I_1$ and additional charging current $I_1'$. When $\Phi_1'$ goes low and $\Phi_1$ remains high, the additional charging current $I_1'$ is switched off and only the charging current $I_1$ is applied to the gate of the driver transistor MD (i.e., $I_{GATE}$=$I_1$). During the initial period of a discharging phase, phase clock signal $\Phi_1''$ is high and $\Phi_1$ is low ($\Phi_1$(bar) is high), both discharging current $I_2$ and additional discharging current $I_2'$ are switched on (i.e., $I_{GATE}$=$I_2$+$I_2'$). When $\Phi_1''$ goes low and $\Phi_1$ is low, additional discharging current $I_2'$ is switched off and only discharging current $I_2$ is applied to the gate of MD (i.e., $I_{GATE}$=$I_2$). Accordingly, the circuit 100 in FIG. 1A produces a step gate current $I_{GATE}$ having sharp edges 160 caused by switching off the additional charging/discharging currents $I_1'$/$I_2'$ responsive to the switching of additional phase clock signals $\Phi_1'$ and $\Phi_1''$. The step gate current $I_{GATE}$ is applied to the gate of transistor MD to produce the LIN bus signal 165 shown in FIG. 1B. The embodiment illustrated in FIGS. 1A and 1B produces satisfactory duty cycle with the shortened delay time, however, performance of radiated emission on the LIN bus is strongly degraded due to the sharp edges 160 in the step current $I_{GATE}$.

Figure 2A:
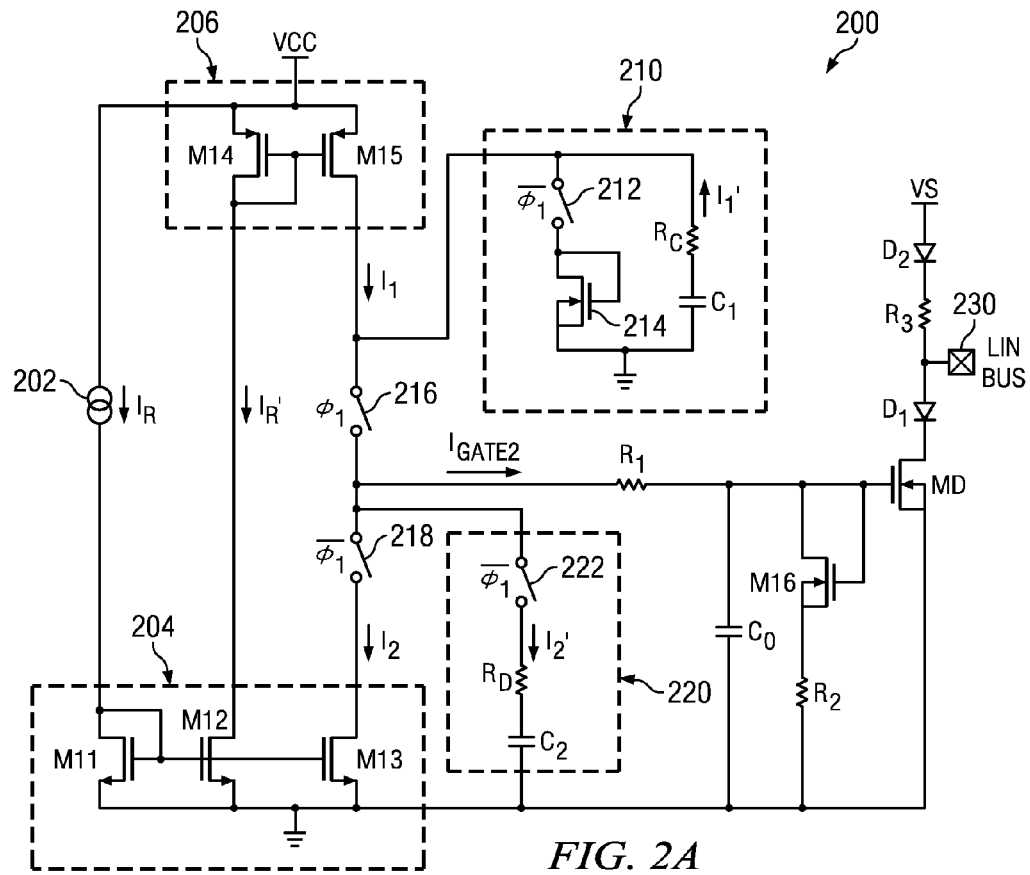
FIGS. 2A and 2B illustrate an LIN driver circuit in accordance with an embodiment of the present disclosure and the timing diagram and waveforms corresponding to the disclosed LIN driver circuit.

FIG. 2A illustrates an LIN driver circuit 200 in accordance with an example embodiment of the present disclosure. The disclosed LIN driver circuit 200 comprises a reference current source 202 supplying reference current $I_R$ to a first current mirror 204, comprised of transistors M11, M12, and M13. Transistor M11 may be sized to transistor M12 to set mirrored reference current $I_R'$, which is supplied to a second current mirror 206 comprised of transistors M14 and M15. Transistor M15 may be sized relative to transistor M14 to set a constant charge current $I_1$, and transistor M13 may be sized relative to transistor M11 to set a constant discharge current $I_2$. In an example embodiment of the circuit 200 illustrated in FIG. 2A, $I_R$=5 uA, $I_R'$=10 uA, $I_1$=20 uA, and $I_2$=20 uA.

Coupled to the second current mirror 206 is charging circuitry 210. The charging circuitry 210 comprises a switch 212 operating on an opposite phase of a clock signal $\Phi_1$, and a diode connected transistor 214 coupled in parallel with series connected capacitor $C_1$ and resistor $R_C$. The charging circuitry 210 and second current mirror 206 are coupled via switch 216 to the gate of a transistor MD operating as a low side driver, wherein switch 216 operates on a phase of the clock signal $\Phi_1$.

Discharging circuitry 220 is coupled to the first current mirror 204 by switch 218 operating on the opposite phase of the clock signal $\Phi_1$. The discharging circuitry 220 comprises a switch 222 coupled in series with a second capacitor $C_2$ and resistor $R_D$, wherein switch 222 operates on the opposite phase of the clock signal $\Phi_1$.

The disclosed LIN driver circuit 200 also includes resistor $R_1$, as well as capacitor $C_0$ coupled in parallel with series connected transistor M16 and resistor $R_2$, which are coupled to the gate of the driver transistor MD. As mentioned above, capacitor $C_0$ is provided to absorb EMC gate coupling of the driver transistor MD, and is also used with resistor $R_1$ to smooth gate charge and discharge of the driver transistor MD. Transistor M16 operates with the driver transistor MD to provide a current mirror, wherein the resistor $R_2$ is provided to adjust the mirror factor. In an example embodiment of the circuit 200 illustrated in FIG. 2A, $C_0$=20 pF.

The source of the driver transistor MD is coupled to the LIN bus 230 via a first blocking diode $D_1$ operable to block current flowing into the LIN bus 230 from ground. The driver circuit 200 also includes a second blocking diode $D_2$ and pull-up resistor $R_3$ coupled between a supply voltage VS and the LIN bus 230, wherein the second blocking diode $D_2$ operates to block current from the LIN bus 230 from reaching the voltage supply VS.

Figure 2B:
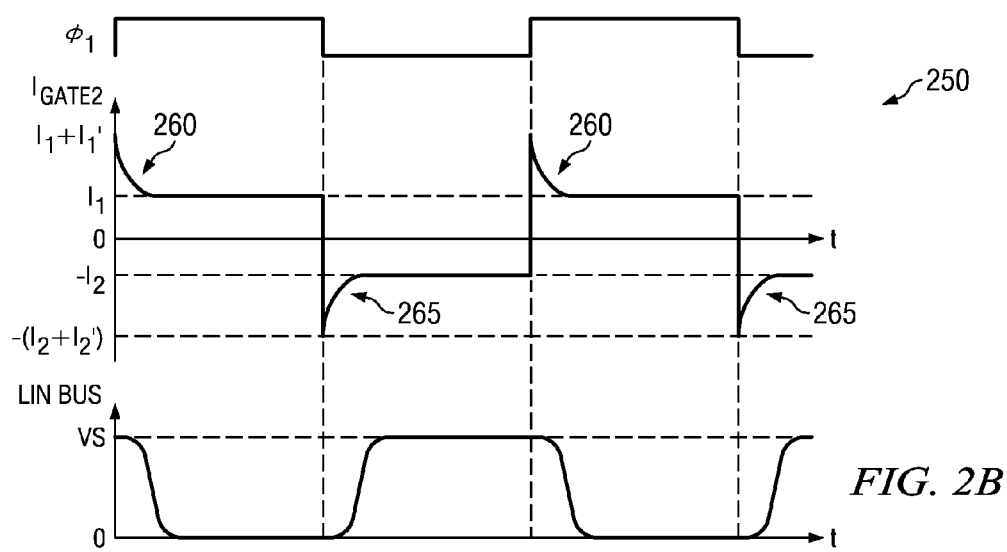

The LIN driver circuit 200 illustrated in FIG. 2A is similar to that shown in FIG. 1A in that the LIN driver circuit 200 employs a charging/discharging current $I_{GATE2}$ applied to the gate of the driver transistor MD coupled to the LIN bus 230. Like the LIN driver circuit 100 in FIG. 1A, the LIN driver circuit 200 achieves satisfactory duty cycle by shortening delay time. However, when compared to the LIN driver circuit 100 in FIG. 1A, the LIN driver circuit 200 illustrated in FIG. 2A provides a significant reduction in electromagnetic emission by replacing the sharp edges 160 shown in FIG. 1B, with a smooth, step-less current change as shown by the timing diagram and waveforms 250 illustrated in FIG. 2B.

In order to achieve the current $I_{GATE2}$, charging and discharging currents are intermittently switched on and off, thereby switching between a charging current and a discharging current applied to the gate of MD as gate current $I_{GATE2}$. During a charging phase, the gate current $I_{GATE2}$ initially comprises the sum of the constant charge current $I_1$ and an additional soft charge current $I_1'$. During a discharging phase, the gate current $I_{GATE2}$ initially comprises the sum of the constant discharge current $I_2$ and an additional soft discharge current $I_2'$. The charging and discharging phases are described in greater detail below with reference to the timing diagram and waveforms 250 illustrated in FIG. 2B.

The phase clock signal $\Phi_1$ represents the charging/discharging phases, wherein $\Phi_1$ is high during the charging phase and low during the discharging phase. Accordingly, charging currents $I_1$ and $I_1'$ are switched on (i.e., applied to the gate of MD) during the charging phase (when $\Phi_1$ is high), and are switched off during the discharging phase (when $\Phi_1$ is low). Conversely, discharging currents $I_2$ and $I_2'$ are switched off during the charging phase, and are switched on during the discharging phase.

Referring again to the circuit 200 illustrated in FIG. 2A, additional soft charging current $I_1'$ is provided by charging circuitry 210. During the gate discharging phase (when $\Phi_1$ is low), switch 212 closes and capacitor $C_1$ is charged by the constant charge current $I_1$ to voltage $V_{GS}$. During the charging phase (when $\Phi_1$ is high), switch 216 closes (and switch 212 opens) and the charge stored on capacitor $C_1$ is transferred as the additional soft charge current $I_1'$ to the gate of MD (along with charge current $I_1$). Accordingly, during the charging phase, gate current $I_{GATE2}$ is comprised of the sum of constant charge current $I_1$ and additional soft charge current $I_1'$. As the charge on the capacitor $C_1$ dissipates, additional soft charge current $I_1'$ decreases exponentially until the gate current $I_{GATE2}$ is essentially comprised of only constant charge current $I_1$, thus smoothly transitioning from a larger initial charge current $(I_1+I_1')$ to the constant charge current $I_1$. The larger initial charge current reduces the turn-on delay time of the driver transistor MD, whereas the smooth exponential transition, shown in FIG. 2B as curve 260, reduces the sharp edges of the gate current $I_{GATE2}$, thereby resulting in decreased electromagnetic emission on the LIN bus 230. In an example embodiment of the circuit 200 illustrated in FIG. 2A, $C_1=10$ pF, $I_1=20$ uA, and $I_1'=220$ uA (peak).

Additional soft discharging current $I_2'$ is provided by discharging circuitry 220. During the discharging phase, switches 218 and 222 close and second capacitor $C_2$ charges to produce the additional soft discharging current $I_2'$ sunk from the gate of MD with constant discharging current $I_2$. Accordingly, during the discharging phase, gate current $I_{GATE2}$ is initially comprised of the sum of constant discharge current $I_2$ and additional soft discharge current $I_2'$. As the charge on the second capacitor $C_2$ increases exponentially, additional soft discharge current $I_2'$ exponentially decreases until the gate current $I_{GATE2}$ is essentially comprised of only constant discharge current $I_2$, thus smoothly transitioning from a larger initial discharge current $(I_2+I_2')$ to the constant discharge current $I_2$. The larger initial discharge current reduces the turn-off delay time of the driver transistor MD, whereas the smooth exponential transition, shown in FIG. 2B as curve 265, reduces the sharp edges of the gate current $I_{GATE2}$, thereby resulting in decreased electromagnetic emis-sion on the LIN bus. In an example embodiment of the circuit 200 illustrated in FIG. 2A, $C_2=15$ pF, $I_2=20$ uA, and $I_2'=350$ uA (peak).

When compared to the conventional LIN driver circuit 100, the disclosed LIN driver 200 provides several advantages including, but not limited to, a) reduced emission degradation of the LIN output, and b) reduced electromagnetic emission on the LIN bus. The disclosed LIN driver circuit 200 eliminates the need for the two additional phase clock signals $\Phi_1'$ and $\Phi_1''$ of FIG. 1A, thereby eliminating emission degradation of the LIN output caused by the spread of clock timing. Additionally, the smooth charge/discharge current comprising the gate current $I_{GATE2}$ provides for reduced electromagnetic emission on the LIN bus 230 as illustrated by the simulation results 300 provided in FIG. 3.

Figure 3:
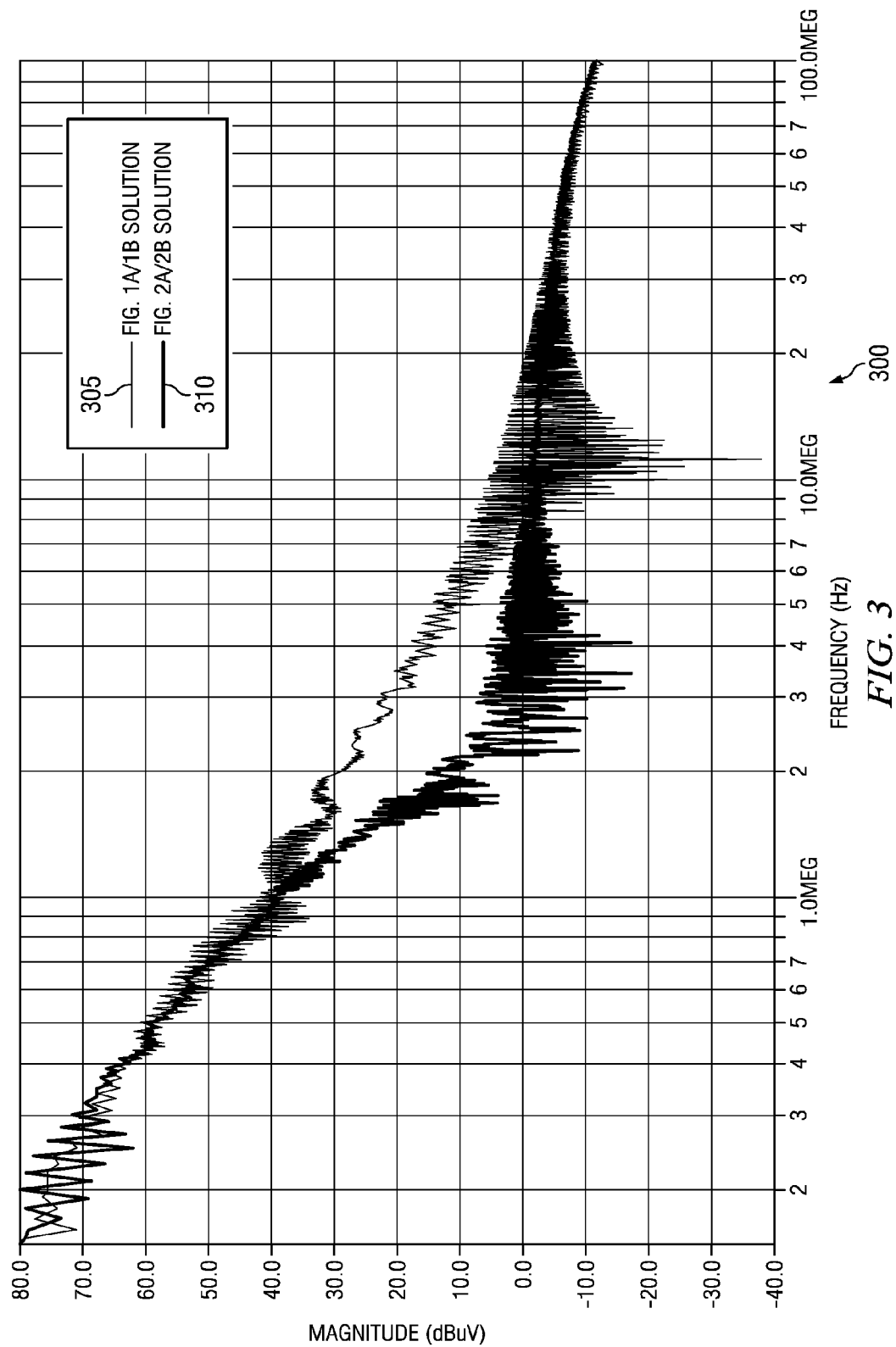
FIG. 3 illustrates a comparison of LIN emission simulation results for the LIN driver circuits shown in FIGS. 1A and 2A.

The simulation results 300 provided in FIG. 3 compare electromagnetic emission on the LIN bus for the circuit 100 illustrated in FIG. 1A (this electromagnetic emission is identified in FIG. 3 as element 305) with electromagnetic emission on the LIN bus for the circuit 200 illustrated in FIG. 2A (this electromagnetic emission is identified in FIG. 3 as element 310). The simulation results 300 illustrate a reduction of up to 17 dBuV in electromagnetic emission on the LIN bus 230 of the circuit 200 illustrated in FIG. 2A, particularly for frequencies ranging from 1 MHz to 10 MHz. As such, the disclosed LIN driver circuit 200 achieves satisfactory duty cycle by shortening delay time while providing a significant reduction in electromagnetic emission by employing a smooth, step-less gate current.

It should be appreciated by one of ordinary skill in the art that the embodiment disclosed herein is provided to illustrate one example for implementing an LIN driver circuit in accordance with the present disclosure. As such, variations to the circuit illustrated in FIG. 2A may be made without departing from the spirit or scope of the present disclosure as set forth in the claims provided below. For example, although a LIN driver is shown, the techniques described herein may be applied to any low side driver circuit, and further, may be used in both sides of a push-pull driver circuit.

What is claimed is:
1. A driver circuit, comprising:
a driver transistor having a gate terminal;
a first circuit operable in response to a first state of a signal to generate a gate charging current for application to the gate terminal; and
a second circuit operable in response to a second state of the signal to generate a gate discharging current for application to the gate terminal;
wherein said gate charging current comprises a sum of a first exponentially decreasing current and a first constant current; and
wherein said gate discharging current comprises a sum of a second exponentially decreasing current and a second constant current;
a first capacitor wherein said first constant current is applied to said first capacitor; and
a clamping transistor selectively coupled in parallel to said first capacitor to generate a charge across said first capacitor for generating said first exponentially decreasing current.
2. The driver circuit as set forth in claim 1, wherein said first circuit comprises a first switch actuated by the first state of the signal to pass the first constant current toward the gate terminal.
3. The driver circuit as set forth in claim 2, wherein said first capacitor configure to be charge during the second state of the signal and discharged during the first state of the signal to generate the first exponentially decreasing current.

4. The driver circuit as set forth in claim 2, wherein said first switch is further operable to pass the first exponentially decreasing current toward the gate terminal.

5. The driver circuit as set forth in claim 1, wherein said second circuit comprises a second switch actuated by the second state of the signal to generate the second constant current toward a ground node.

6. The driver circuit as set forth in claim 1, wherein said second circuit comprises a third switch actuated by the second state of the signal to generate the second exponentially decreasing current.

7. The driver circuit as set forth in claim 6, wherein said second circuit further comprises a second capacitor that is charged during the second state of the signal to generate the second exponentially decreasing current.

8. The driver circuit as set forth in claim 1, wherein the first exponentially decreasing current commences coincident with said first state of the signal.

9. The driver circuit as set forth in claim 1, wherein the second exponentially decreasing current commences coincident with said second state of the signal.

10. An integrated driver circuit, comprising:
charging circuitry operable to receive a first charging current and generate a second charging current;
discharging circuitry operable to receive a first discharging current and generate a second discharging current; and
an output transistor operable to receive a gate current, wherein during a charging phase, said gate current comprises said first charging current and said second charging current, and wherein during a discharging phase, said gate current comprises said first discharging current and said second discharging current;
wherein during said charging phase, said second charging current dissipates such that said gate current substantially comprises said first charging current; and
wherein during said discharging phase, said second discharging current dissipates such that said gate current substantially comprises said first discharging current.

11. The integrated driver circuit as set forth in claim 10, wherein said second charging current commences coincident with said discharging phase.

12. The integrated driver circuit as set forth in claim 10, wherein said second discharging current commences coincident with said discharging phase.

13. The integrated driver circuit as set forth in claim 10, wherein said charging circuitry comprises a first capacitor selectively coupled in parallel with a clamping transistor.

14. The integrated driver circuit as set forth in claim 10, wherein said discharging circuitry comprises a second capacitor operable to generate said second discharging current.

15. The integrated driver circuit as set forth in claim 10, wherein said second charging current dissipates such that said gate current achieves a smooth reduction in charge current.

16. The integrated driver circuit as set forth in claim 10, wherein said second discharging current dissipates such that said gate current achieves a smooth reduction in discharge current.

17. The integrated driver circuit as set forth in claim 10, wherein said gate current alternates between said charging phase and said discharging phase.

18. The integrated driver circuit as set forth in claim 10, wherein said first charging current is a constant current.

19. The integrated driver circuit as set forth in claim 10, wherein said first discharging current is a constant current.

20. A driver circuit, comprising:
a driver transistor having a gate terminal;
a first circuit comprising a first capacitor coupled to a first transistor and a first switch, said first circuit operable to receive a first constant current and generate a first exponentially decreasing current;
a second switch operable to couple said first circuit to said gate terminal to apply a gate charging current to said gate terminal;
a second circuit coupled to said gate terminal, said second circuit comprising a third switch and a second capacitor, said second circuit operable to generate a second exponentially decreasing current; and
a fourth switch coupled to said gate terminal and said second circuitry, wherein said third and fourth switches are operable to apply a gate discharging current to said gate terminal;
wherein said gate charging current comprises a sum of said first exponentially decreasing current and said first constant current; and
wherein said gate discharging current comprises a sum of said second exponentially decreasing current and a second constant current.

21. The driver circuit as set forth in claim 20, further comprising a reference current generator.

22. The driver circuit as set forth in claim 20, further comprising a first current mirror coupled to said second circuit and said fourth switch.

23. The driver circuit as set forth in claim 22, wherein said first current mirror is operable to generate said second constant current.

24. The driver circuit as set forth in claim 20, further comprising a second current mirror coupled to said first circuit and said second switch.

25. The driver circuit as set forth in claim 24, wherein said second current mirror is operable to generate said first constant current.

26. The driver circuit as set forth in claim 20, further comprising a gate resistor coupled to said gate terminal.

27. The driver circuit as set forth in claim 20, further comprising a third capacitor coupled to said gate terminal, said third capacitor coupled in parallel with said second circuit.

28. The driver circuit as set forth in claim 20, further comprising a second transistor coupled to said gate terminal.

29. The driver circuit as set forth in claim 28, further comprising a second resistor coupled in series with said second transistor, said second resistor and second transistor coupled in parallel with said second circuit.

30. The driver circuit as set forth in claim 20, further comprising an output bus coupled to a source terminal of said driver transistor.

31. The driver circuit as set forth in claim 30, further comprising a first diode coupled between said source terminal and said output bus.

32. The driver circuit as set forth in claim 30, further comprising a second diode and pull-up resistor coupled in series between said output bus and a voltage source.

33. The driver circuit as set forth in claim 20, wherein said first circuit further comprises a fourth resistor coupled to said first capacitor.

34. The driver circuit as set forth in claim 20, wherein said second circuit further comprises a fifth resistor coupled to said second capacitor.

35. A method, comprising:
generating a first exponentially decreasing current in response to a first state of a signal;

generating a second exponentially decreasing current in response to a second state of the signal;

applying a charging current at a gate terminal of a driver transistor, wherein said charging current comprises a sum of a first constant current and said first exponentially decreasing current; and applying a discharging current at said gate terminal of said driver transistor, wherein said discharging current comprises a sum of a second constant current and said second exponentially decreasing current;

wherein generating said first exponentially decreasing current comprises applying said first constant current to a first capacitor selectively coupled in parallel with a clamping transistor to generate a charge across said first capacitor.

36. The method as set forth in claim 35, wherein generating said second exponentially decreasing current comprises applying current drawn from said gate terminal across a second capacitor.

* * * * *

UNITED STATES PATENT AND TRADEMARK OFFICE
CERTIFICATE OF CORRECTION

| | | |
|---|---|---|
| PATENT NO. | : 8,829,950 B2 | Page 1 of 1 |
| APPLICATION NO. | : 13/713285 | |
| DATED | : September 9, 2014 | |
| INVENTOR(S) | : Tina Shen et al. | |

It is certified that error appears in the above-identified patent and that said Letters Patent is hereby corrected as shown below:

In the Claims:

At column 6, claim number 3, line number 67, please replace the phrase [configure to be charge] with -- configured to be charged --.

Signed and Sealed this
Twenty-third Day of December, 2014

Michelle K. Lee
*Deputy Director of the United States Patent and Trademark Office*